United States Patent [19]

Hysell et al.

[11] 4,170,019

[45] Oct. 2, 1979

[54] SEMICONDUCTOR DEVICE WITH VARIABLE GRID OPENINGS FOR CONTROLLING TURN-OFF PATTERN

[75] Inventors: Robert E. Hysell, Berwyn; Dante E. Piccone, Glenmoore, both of Pa.

[73] Assignee: General Electric Company, Philadelphia, Pa.

[21] Appl. No.: 822,117

[22] Filed: Aug. 5, 1977

[51] Int. Cl.² ............................................. H01L 29/80
[52] U.S. Cl. ........................................ 357/22; 357/38; 357/55; 357/86
[58] Field of Search .................. 357/22, 38, 86, 55

[56] References Cited

U.S. PATENT DOCUMENTS

| | | | |
|---|---|---|---|
| 3,274,461 | 9/1966 | Teszner | 357/22 |
| 3,657,573 | 4/1972 | Maute | 357/22 |

Primary Examiner—Edward J. Wojciechowicz
Attorney, Agent, or Firm—William Freedman; Carl L. Silverman

[57] ABSTRACT

A field terminated diode device includes contiguous anode, base, and cathode regions, which are respectively P+, N−, and N+ semiconductor material. The N− base region includes therein a grid region of P type semiconductor material. The grid region includes grid openings which define channels in the grid region for communicating charge carriers between the anode and cathode regions. Means are provided for electrically connecting to the anode and cathode regions and to the grid region. In one embodiment, the grid channels are nonuniform in that their average widths increase from the center to the perimeter of the device. In another embodiment, the nonuniform channels are distributed throughout the grid region.

11 Claims, 4 Drawing Figures ized in size. More spe- 

SEMICONDUCTOR DEVICE WITH VARIABLE GRID OPENINGS FOR CONTROLLING TURN-OFF PATTERN

BACKGROUND OF THE INVENTION

The present invention relates to a semiconductor device employing a grid, and more particularly to such a device which includes variable grid openings for controlling the device turn-off pattern.

Field terminated diode (FTD) devices, also known as gridistors, have heretofore been disclosed. Such a device can be generally described as a field effect transistor which employs the principle of centripetal striction and has a multichannel structure. In general, the device functions as a power rectifier with forward blocking capability. Briefly, in such a device, a grid is included within a power rectifier structure. An exemplary device structure includes: an outer P+ anode region; an intermediate N− base region; an outer N+ cathode region; and a P type grid structure. Further information on such a device can be found in the article of Houston et al, entitled, "A Field Terminated Diode," Vol. ED-23, August, 1976, of *IEEE Transactions on Electron Devices*.

Although field terminated diode devices exhibit many valuable characteristics, their use has not yet become wide spread due to several problems. One such problem is that satisfactory turn-off of the device is often difficult to achieve. During device turn-off, a lateral current flows through the grid, resulting in a voltage drop along the grid due to the lateral resistance of the grid structure. This voltage drop along the grid frequently causes grid debiasing effects in which the grid areas most remote from the point at which the bias is applied turn off last. For example, in a conventional device, where the bias is applied to the grid through an electrical contact point at its peripheral or outer regions, the debiasing causes the outer grid regions to turn off first and the center of the device to turn off last. This type of nonuniform turn-off pattern or characteristic is undesirable for many applications. This nonuniform turn-off pattern, especially center turn-off last, may create current and heat concentrations in the device which result in device failure.

SUMMARY OF THE INVENTION

A general object of this invention is to provide a semiconductor device employing a grid which exhibits improved turn-off characteristics.

Another general object of this invention is to provide such a semiconductor device having controlled turn-off characteristics.

Another object of this invention is to provide such a semiconductor device having reduced current and heat concentrations during turn-off.

In carrying out the invention in one form, we provide a semiconductor device including at least three contiguous regions of semiconductor material. Two of these regions are outer regions and the other is an intermediate region located between the two outer regions. A grid region is in electrically contacting relation with the intermediate region. The grid region is of opposite conductivity type in relation to the intermediate region. The grid region includes therein a plurality of openings which define channels in the grid region for communicating charge carriers between the outer regions of semiconductor material. At least some of the channels have pinch off voltages associated therewith which are nonuniform in relation to others of the channels. Means are provided for electrically connecting to each of the outer regions of the semiconductor material and to the grid region.

BRIEF DESCRIPTION OF THE DRAWINGS

Our invention will be better understood and its various objects and advantages will be more fully appreciated from the following description taken in conjunction with the accompanying drawing in which.

DETAILED DESCRIPTION OF THE INVENTION

Figure 1:
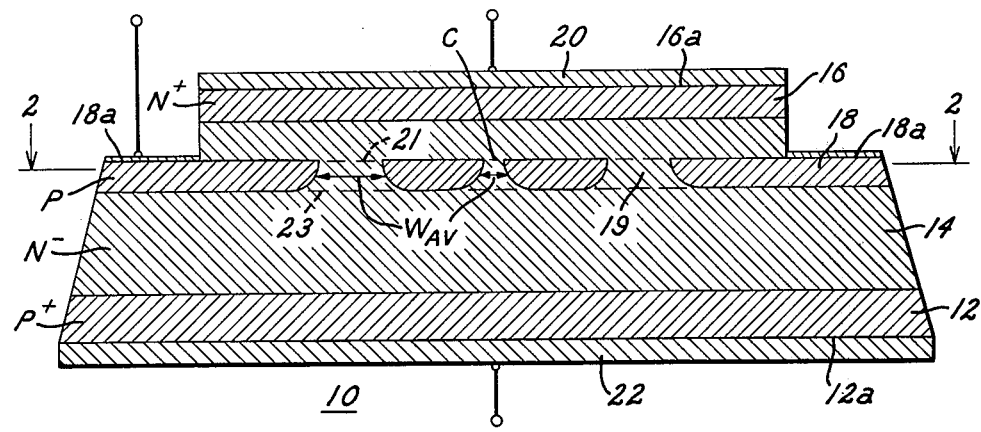
FIG. 1 is a simplified cross sectional view showing a portion of one form of semiconductor device to which the present invention relates.

Referring initially to FIG. 1, one form of semiconductor device of the present invention is generally designated 10. The device 10 is also known as a field terminated diode. The exemplary semiconductor device 10 includes three contiguous regions of semiconductor material: an outer P+ (e.g., $2 \times 10^{19}/cm^3$) anode region 12, an intermediate N− (e.g., $4 \times 10^{13}/cm^3$) base region 14, and an outer N+ (e.g., $1 \times 10^{20}/cm^3$) cathode region 16. The anode region 12 and the base region 14 form a PN junction therebetween. In a preferred embodiment, the device 10 is circular and has a diameter of about 40 mm. In this preferred embodiment, the anode region 12 has a thickness of about 177 microns, the base region 14 has a thickness of about 355 microns, and the cathode region 16 has a thickness of about 5 microns.

A grid region 18 is provided within the intermediate base region 14. The grid region 18 includes a plurality of openings which define channels 19 in the grid region 18 for communicating charge carriers through the intermediate base region 14 between the outer anode and cathode regions 12 and 16. The grid region 18 comprises a semiconductor material of opposite conductivity type to the surrounding intermediate base region 14. In the present embodiment, the intermediate base region 14 is N− and the grid region 18 comprises P type (e.g., $5 \times 10^{20}/cm^3$) semiconductor material. The thickness of the grid region 18 is about 50 microns. The grid region 18 includes a peripheral edge 18a which is metallized and is accessible for applying a biasing potential thereto. Conductive coatings 20 and 22 are respectively disposed on the surfaces 16a and 12a of the cathode and anode regions 16 and 12. Electrical connections to the device 10 are provided by electrical terminals through the conductive coatings 20 and 22 and through the accessible metallized peripheral edge 18a of the grid region 18, as shown diagrammatically in FIG. 1.

Figure 2:
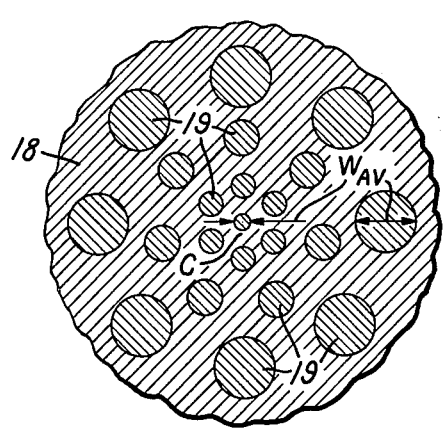
FIG. 2 is a sectional view taken along line 2—2 showing an exemplary grid structure of the present invention. The view is reduced in size but expanded in detail.

The grid region 18 of the semiconductor device 10 can be more completely described by referring to FIGS. 1 and 2. Note that, for purposes of clarity, FIG. 2 is a sectional view of FIG. 1 which is reduced in size but expanded in grid detail. In the exemplary device 10, the grid channels 19 are not uniform in size. More specifically, each of the channels 19 has a pair of opposing openings 21 and 23. The respective openings 21 and 23 of the channels 19 are substantially coplanar. In the device 10, the openings 21 of different channels 19 are not uniform in size. Similarly, the openings 23 of different channels 19 are not uniform in size. In the device 10, the grid openings 21 and 23 increase in size as the outside diameter of peripheral edge 18a of the grid region 18 is approached.

For clarity of description, it is helpful to refer to a point in the grid channels 19 which represents the average width of the channel 19, hereinafter designated $W_{av}$. Generally, this point is found midway between openings 21 and 23. In the exemplary device 10, the average width ($W_{av}$) of the channels 19 increases from about 10 microns near the center (C) of the device to about 20 microns near the peripheral edge 18a of the device. Generally, in the semiconductor device of the present invention, the nonuniformity of average width of the channels will be at least one the order of about 1.5 to 1.

In the operation of the semiconductor device 10, ON condition is provided by forward biasing the anode and cathode junction without biasing the grid region 18. Typically, this is accomplished by electrically biasing the cathode region 16 at least about 0.6 volts negative with respect to the anode region 12. In this condition, excess holes and electrons injected into the intermediate N− base region 14 lower its resistivity, resulting in a low on state voltage drop between the anode and cathode regions 12 and 16 typical of a power rectifier.

OFF condition is provided by reverse biasing the grid region 18 with respect to the cathode region 16. Typical grid reverse biasing voltages are greater than about 2 volts. With this reverse biasing condition, current which had been going from the anode region 12 to the cathode region 16 is diverted to the grid region 18 which has now become an efficient collector of holes.

It is at this point that the grid structure of the present invention can be more fully appreciated. As previously mentioned, in conventional uniform grid structure devices, undesirable grid debiasing effects result in poor turn-off patterns. However, in the grid structure of the present invention, these undesirable grid debiasing effects are minimized or avoided.

In the semiconductor device 10 shown in FIGS. 1 and 2, the nonuniform openings 21 and 23 of the grid channels 19 interact with, and compensate for the lateral voltage drop along the grid region 18 thereby minimizing the undesirable debiasing effects. More specifically, the lower voltage near the center (C) of the grid region 18 caused by the voltage drop along the grid region 18 is compensated for by the smaller average width ($W_{av}$) of the channels 19 near the center. That is, the smaller average width ($W_{av}$) of the channels 19 located in the lower voltage region near the center (C) of the grid region require a smaller voltage to turn off current flow therethrough as compared to the larger average widths of the channels 19 which are located in the higher voltage region of the grid region. As a result, the use of the nonuniform grid structure shown in FIGS. 1 and 2 allows the semiconductor device 10 to be turned off uniformly over the entire device area, i.e., over the entire grid region 18.

It is to be appreciated that, for certain applications, other forms of the grid structure of the present invention may be appropriate. For example, by increasing the relative size difference between the average widths of the channels in the center and peripheral regions of the device 10 shown in FIGS. 1 and 2, the last turn off point can be located near the peripheral region 18a of the grid. This condition may be desirable as the voltage at the peripheral region 18a is minimally affected by the lateral resistance of the grid. In addition, this mode of turn-off may offer improved heat sinking possibilities as compared to conventional center turn-off.

Figure 3:
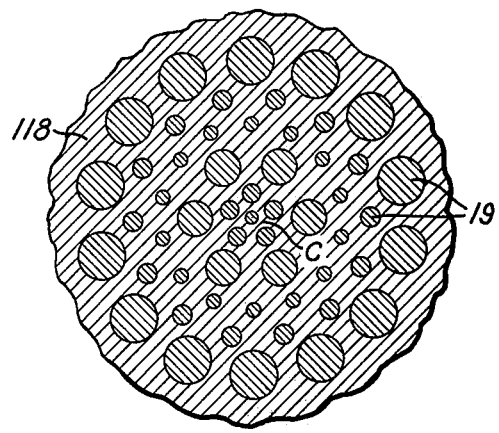
FIG. 3 is a sectional view, taken as in FIG. 2, showing another exemplary grid structure of the present invention.

Another embodiment of the semiconductor device of the present invention is partially shown in FIG. 3. In the grid region 118, the nonuniform grid channels 19 are distributed throughout the grid region in an arrangement such that, upon the application of an appropriate negative grid bias, the last points to turn off are spread over the area of the grid. In this embodiment, the larger channels 19 are last to turn off. Thus, in this embodiment, the last points to turn off are spread over the grid region thereby spreading the heat loss during turn-off.

Figure 4:
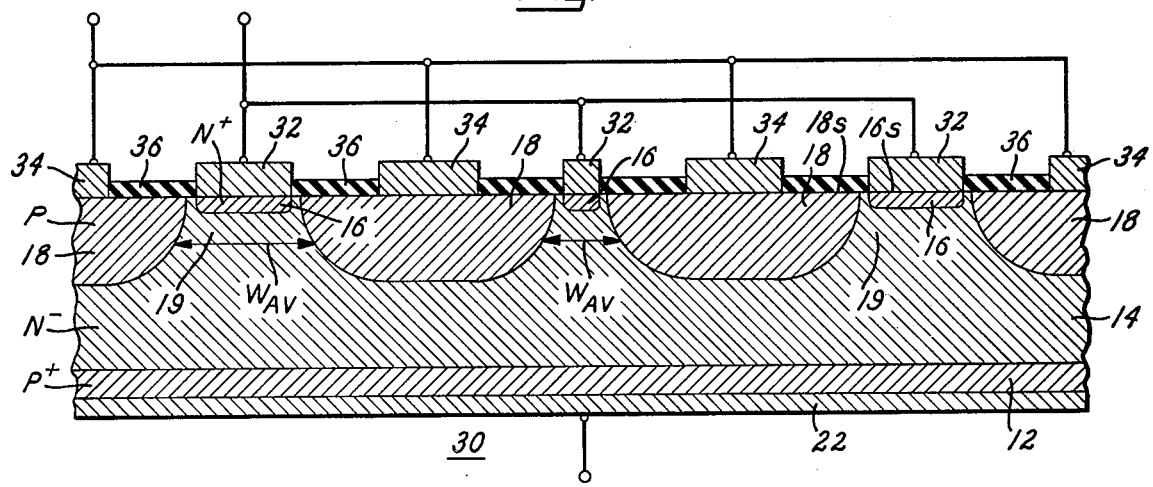
FIG. 4 is a cross sectional view showing a portion of another form of semiconductor device to which the present invention relates.

Although the nonuniform grid structure of the present invention has heretofore been described in connection with a buried grid semiconductor device, it is also applicable to other semiconductor devices employing grids. For example, the nonuniform grid structure may be employed in a field controlled thyristor (FCT) such as the one described in the previously mentioned article of Houston et al. A portion of one such device is shown in FIG. 4 and is generally designated 30. The device 30 is substantially the same as the field terminated diode (FTD) device 10 of FIGS. 1–3 so that, where possible, like elements are identified by like reference numerals. There is, however, one important difference between the field terminated diode device 10 of FIGS. 1–3 and the field controlled thyristor device 30 of FIG. 4. In the FCT device 30, the grid region 18 is not buried within the intermediate base region 14. Instead, the FCT device 30 includes a planar grid region 18 having a surface 18s which is substantially coplanar with a surface 16s of the cathode region 16. A conductive coating 32 contacts the cathode regions 16 and a second conductive coating 34 is in electrical contact with the grid region 18. The conductive coatings 32 and 34 are electrically insulated from each other by an oxide coating 36.

The FCT device 30 of FIG. 4 permits the undesirable voltage drop which would develop along the grid region 18 to be substantially minimized as, in this structure, the grid current travels through the conductive coating 34 instead of the higher resistance grid material. However, in device applications where relatively high currents are employed, the voltage drop along the conductive coating 34 may still cause undesirable grid debiasing effects. Further, as previously mentioned, for certain device applications, such as those where local heating is of concern, it may be desirable to obtain a particular turn-off pattern. For these applications, the nonuniform grid structure of the present invention is generally more desirable than the uniform grid structure of conventional devices.

The devices of the present invention can be constructed through the use of conventional processing technology. One such technique includes forming the grid region through a diffusion process into a semiconductor wafer through a suitably apertured oxide mask. This is followed by an epitaxial deposition on top of the diffused in grid region. More information on construction techniques is disclosed in U.S. Pat. No. 3,497,777, issued Feb. 24, 1970 to Teszner, entitled, "Multichannel Field-Effect Semiconductor Device," which is hereby incorporated by reference in the present application.

Although the exemplary semiconductor devices of the present invention have been described with particular materials and dimensions, it is to be understood that variations are available. For example, in one such variation, the device may include the following contiguous regions: N; P; P+. In such a device, an N+ grid region is in contacting relation with the intermediate P type region. Similarly, in other devices, the dimensional quantities may be varied. In any dimensional variation, however, it is necessary that at least some of the grid channels be nonuniform with respect to the other grid channels. For example, as hereinbefore described, at least some of the grid channels should exhibit average widths which are nonuniform with respect to the average widths of others of the channels. In connection with the term, average width, it is to be noted that, under certain conditions, the average width of each of the grid channels is not taken at the midpoint of the grid channel.

Although the exemplary semiconductor devices of the present invention have been described with circular type nonuniform grid channels and openings, many variations are possible. For example, the grid openings may be triangular, square or rectangular. The geometric shape of the channels and openings need not be the same throughout the grid region: the grid may, for example, include openings of varied shaped such as circular and rectangular. In such a structure, the term, average width, generally applies to the smallest dimension of the channel. In any variation, however, it is necessary that at least some of the grid channels and openings be nonuniform such that, upon application of a grid biasing voltage, undesirable grid debiasing effects are controlled, or compensated for, thereby resulting in the desired predetermined device turn-off characteristic.

It is to be appreciated that, for purposes of clarity, the nonuniform grid channels of the present invention have been hereinbefore described in connection with the term, average width. The nonuniform grid channels of the present invention may also be described in relation to pinch off voltage. The pinch off voltage is typically defined as the minimum voltage necessary at a grid channel for that channel to assume blocking capability. Thus, in the nonuniform grid channels of the present invention, at least some of the channels have associated therewith nonuniform pinch off voltages. In one embodiment, the grid channels near the center of the grid region have lower pinch off voltages associated therewith as compared to the channels near the periphery of the grid region. In this embodiment, the voltage drop along the grid region caused by the lateral resistance of the grid region during device turn off is compensated for by the nonuniform pinch off voltages of the grid channels. As a result, the device turns off uniformly. Referring again to the term, average width, it is to be appreciated that, in general, the average width of a grid channel is an adequate measure of the pinch off voltage associated therewith. In this connection, generally, a grid channel with a relatively large average width has a relatively high pinch off voltage associated therewith whereas a grid channel with a relatively small average width has a relatively low pinch off voltage associated therewith.

While various alternative forms of our invention have been shown and described in detail by way of illustration, other modifications will probably occur to those skilled in the art. We therefore contemplate by the concluding claims to cover all such modifications as fall within the true spirit and scope of the invention.

What we claim as new and desire to secure by Letters Patent of the United States is:

1. A semiconductor device, which comprises:
   (a) at least three contiguous layers of semiconductor material including two outer layers and an intermediate layer disposed therebetween, said contiguous layers forming a PN junction therebetween;
   (b) a grid region in electrically contacting relation with said intermediate layer, said grid region being of opposite conductivity type in relation to said intermediate layer, said grid region including therein a plurality of openings which define channels in said intermediate layer for communicating charge carriers between said outer layers, at least some of said channels having pinch off voltages associated therewith which are different from others of said channels such that, when said grid region is provided with an electrical potential for turning off the communication of charge carriers through said channels, a predetermined turn off characteristic is provided by the interaction of a lateral voltage drop along said grid region and said different pinch off voltages among said channels wherein current and heat concentrations at the center of said semiconductor device during turn-off are minimized; and,
   (c) means for electrically connecting to each of said outer layers and to said grid region.

2. A semiconductor device in accordance with claim 1 in which at least some of said channels have average widths which are different.

3. A semiconductor device in accordance with claim 2 in which at least some of said channels have average widths which are related to others of said channels by the ratio of at least about 1.5 to 1.

4. A semiconductor device in accordance with claim 1 in which at least some of said channels near the center of said grid region have relatively smaller pinch off voltages as compared to said channels near the periphery of said grid region such that when said grid region is provided with said turn off electrical potential, said voltage drop along said grid region is substantially compensated for by the smaller electrical potential needed to turn off said channels having said relatively smaller pinch off voltages and said device turns off substantially uniformly over said grid region.

5. A semiconductor device in accordance with claim 4 in which at least some of said channels near the center of said grid region have relatively smaller average widths as compared to said channels near the periphery of said grid region and in which said means for electrically connecting to said grid region comprises means connected to said periphery of said grid region.

6. A semiconductor device in accordance with claim 1 in which said grid region is buried within said intermediate layer of semiconductor material.

7. A semiconductor device in accordance with claim 1 in which said contiguous layers respectively comprise P+ semiconductor material, N− semiconductor material, N+ semiconductor material and said grid region comprises P type semiconductor material.

8. A semiconductor device in accordance with claim 1 in which said contiguous layers respectively comprise P+ type semiconductor material, P type semiconductor material, N type semiconductor material and said grid region comprises N+ type semiconductor material.

9. A semiconductor device in accordance with claim 1 in which at least some of said channels near the center of said grid region have relatively smaller pinch off voltages as compared to said channels near the periphery of said grid region such that when said grid region is provided with said turn off electrical potential, the interaction of said lateral voltage drop along said grid region and said different pinch off voltages among said channels causes said device to turn off last at the periphery of said grid region.

10. A semiconductor device in accordance with claim 1 in which said channels having different pinch off voltages are distributed throughout said grid region such that when said grid region is provided with said turn off electrical potential, the interaction of said lateral voltage drop along said grid region and said different pinch off voltages causes said device to turn off last at points spread over said grid region.

11. A semiconductor device, which comprises:
(a) at least three contiguous layers of semiconductor material including two outer layers and an intermediate layer disposed therebetween, said contiguous layers forming a PN junction therebetween;
(b) a grid region in electrically contacting relation with said intermediate layer, said grid region being of opposite conductivity type in relation to said intermediate layer, said grid region including therein a plurality of openings which define channels in said intermediate layer for communicating charge carriers between said outer layers, at least some of said channels having pinch off voltages associated therewith which are different from others of said channels with at least some of said channels near the center of said grid region having relatively smaller pinch off voltages as compared to said channels near the periphery of said grid region, such that when said grid region is provided with an electrical potential for turning off the communication of charge carriers through said channels said device turns off last at the periphery of said grid region; and,
(c) means for electrically connecting to each of said outer layers and to said grid region.

* * * * *